US009385149B2

(12) United States Patent
Rohr et al.

(10) Patent No.: US 9,385,149 B2
(45) Date of Patent: Jul. 5, 2016

(54) CMOS IMAGING DEVICE HAVING OPTIMIZED SHAPE, AND METHOD FOR PRODUCING SUCH A DEVICE BY MEANS OF PHOTOCOMPOSITION

(71) Applicant: COMMISSARIAT A L'ENERGIE ATOMIQUE ET AUX ENERGIES ALTERNATIVES, Paris (FR)

(72) Inventors: Pierre Rohr, Apprieu (FR); Jean-Luc Martin, Saint Geoire en Valdaine (FR); Bruno Bosset, Voiron (FR); Bertrand Dupont, Gargas (FR)

(73) Assignees: Commissariat A L'Energie Atomique et aux Energies Alternatives, Paris (FR); Trixell, Moirans (FR)

( * ) Notice: Subject to any disclaimer, the term of this patent is extended or adjusted under 35 U.S.C. 154(b) by 0 days.

(21) Appl. No.: 14/412,619

(22) PCT Filed: Jul. 5, 2013

(86) PCT No.: PCT/EP2013/064320

§ 371 (c)(1),
(2) Date: Apr. 17, 2015

(87) PCT Pub. No.: WO2014/006214

PCT Pub. Date: Jan. 9, 2014

(65) Prior Publication Data

US 2015/0303228 A1 Oct. 22, 2015

(30) Foreign Application Priority Data

Jul. 5, 2012 (FR) ..................................... 12 56469

(51) Int. Cl.
*G01T 1/24* (2006.01)
*H01L 27/146* (2006.01)

(Continued)

(52) U.S. Cl.
CPC .... *H01L 27/14607* (2013.01); *H01L 27/14603* (2013.01); *H01L 27/14663* (2013.01);

(Continued)

(58) Field of Classification Search
CPC .................... H01L 27/1469; H01L 27/14663; H01L 27/14643
USPC .......................................................... 250/366
See application file for complete search history.

(56) References Cited

U.S. PATENT DOCUMENTS

2008/0101534 A1* 5/2008 Ikhlef .................... A61B 6/032 378/19
2008/0128698 A1* 6/2008 Martin ................ G03F 7/70433 257/55

(Continued)

FOREIGN PATENT DOCUMENTS

EP 0328410 A2 8/1989
EP 1255401 A1 11/2002

(Continued)

*Primary Examiner* — David Porta
*Assistant Examiner* — Meenakshi Sahu
(74) *Attorney, Agent, or Firm* — Baker & Hostetler LLP

(57) ABSTRACT

An imaging device comprises a sensor of surface area of at least 10 $cm^2$ and comprising: an image zone produced on a single substrate and comprising a group of pixels disposed in rows and columns, the number of pixels per column not being uniform for all the columns of pixels, each pixel collecting electric charges generated by a photosensitive element, row conductors linking the pixels row by row, column conductors linking the pixels column by column, row addressing blocks linked to the row conductors to address each row of pixels individually, and column reading blocks linked to the column conductors to read the electric charges collected by the pixels of the row selected by the row addressing blocks, the column reading blocks being situated at the periphery of the image zone; the row addressing blocks and the column reading blocks being produced on the same substrate as the image zone.

35 Claims, 9 Drawing Sheets

(51) Int. Cl.

| | |
|---|---|
| ***H04N 5/374*** | (2011.01) |
| ***H04N 5/376*** | (2011.01) |
| ***H01L 31/0272*** | (2006.01) |
| ***H01L 31/0296*** | (2006.01) |
| ***H01L 31/0304*** | (2006.01) |
| ***H01L 31/032*** | (2006.01) |
| ***H04N 5/369*** | (2011.01) |
| ***H04N 5/378*** | (2011.01) |

(52) U.S. Cl.

CPC ...... *H01L27/14687* (2013.01); *H01L 31/0272* (2013.01); *H01L 31/0296* (2013.01); *H01L 31/02966* (2013.01); *H01L 31/032* (2013.01); *H01L 31/0304* (2013.01); *H04N 5/3696* (2013.01); *H04N 5/376* (2013.01); *H04N 5/378* (2013.01); *H04N 5/3742* (2013.01)

(56) References Cited

U.S. PATENT DOCUMENTS

2009/0033777 A1 2/2009 Ligozat et al.
2010/0002115 A1* 1/2010 Liu .................. H01L 27/14634 348/308
2010/0118168 A1 5/2010 Silva et al.
2010/0141820 A1* 6/2010 Chenebaux ....... H01L 27/14609 348/302

FOREIGN PATENT DOCUMENTS

FR 2888044 A1 1/2007
WO 2007014293 A1 2/2007
WO 2009133154 A1 11/2009

* cited by examiner

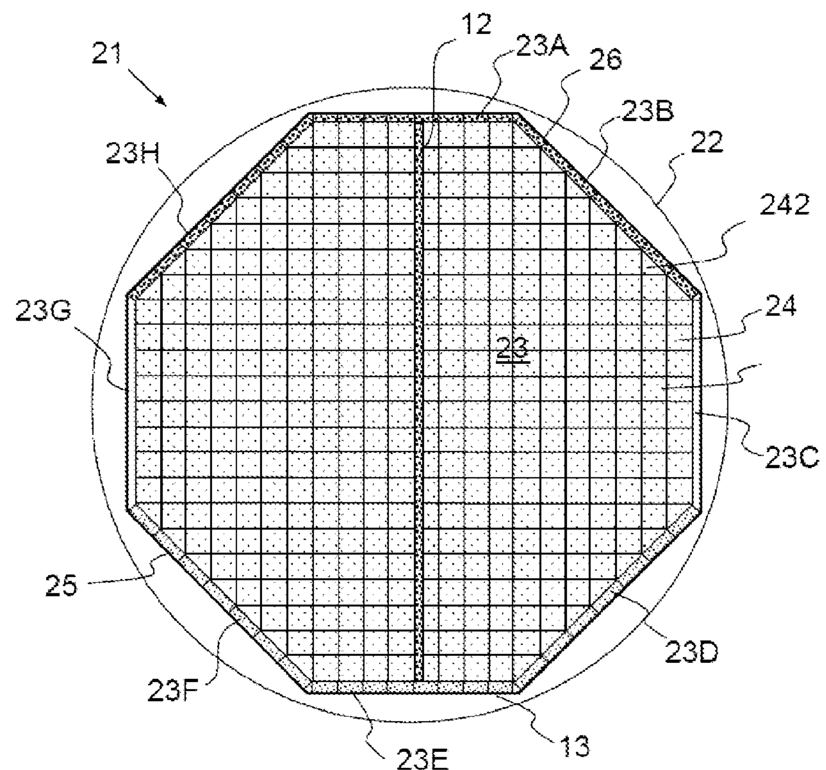
FIG.2
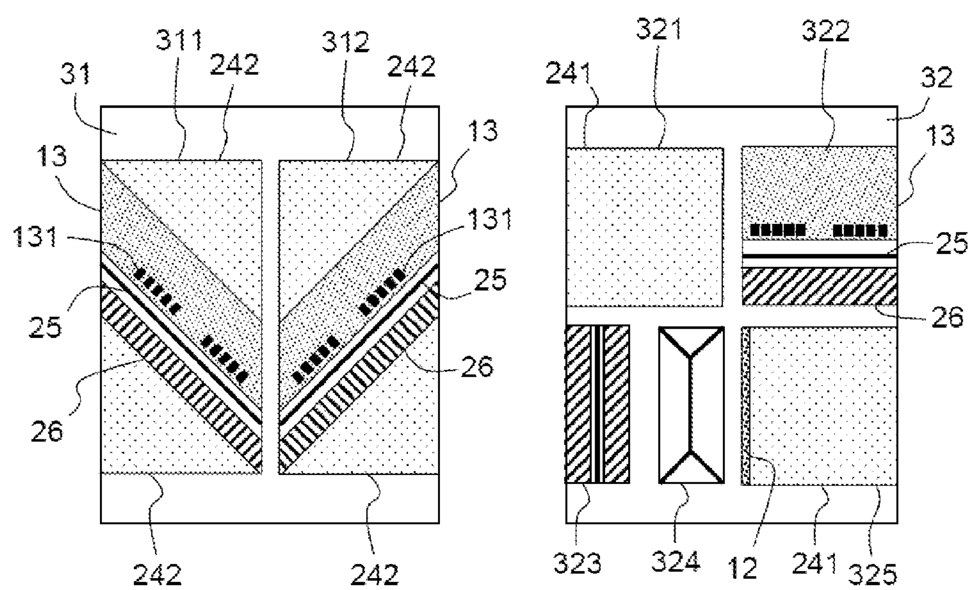
FIG.3A
FIG.3B

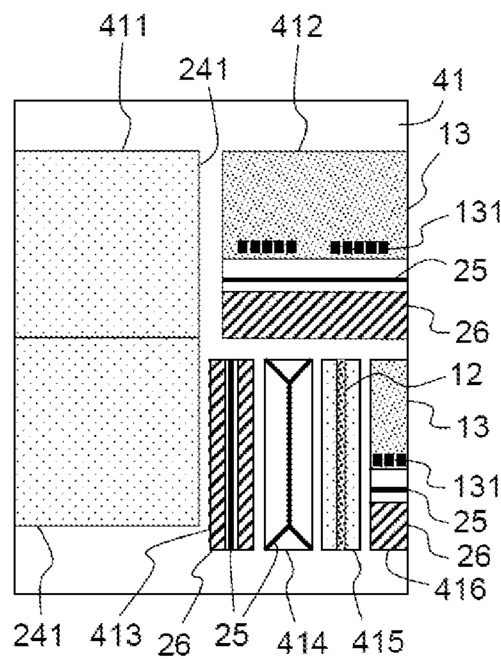
FIG.4
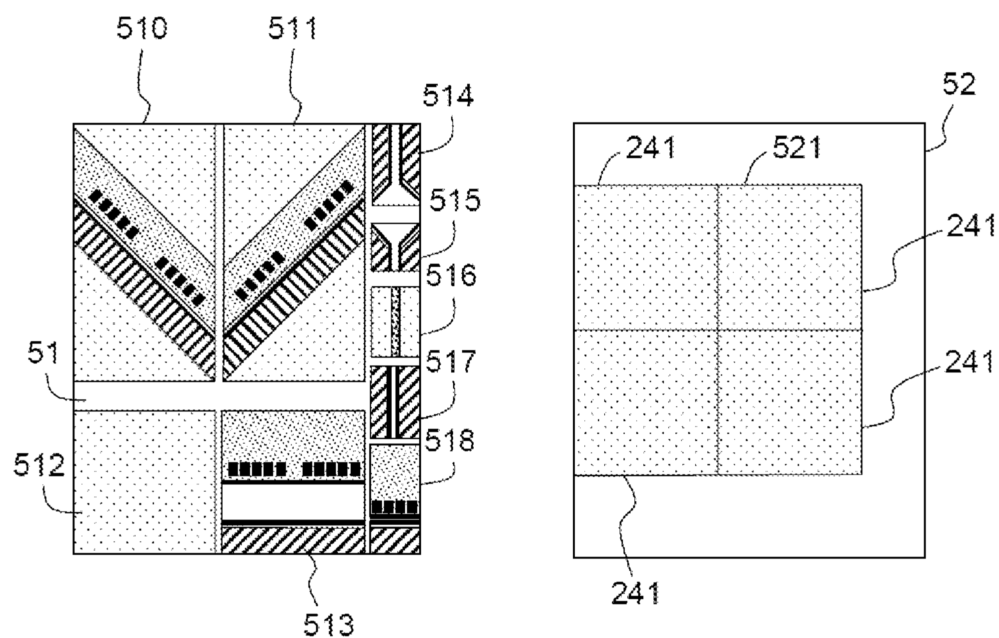
FIG.5A
FIG.5B

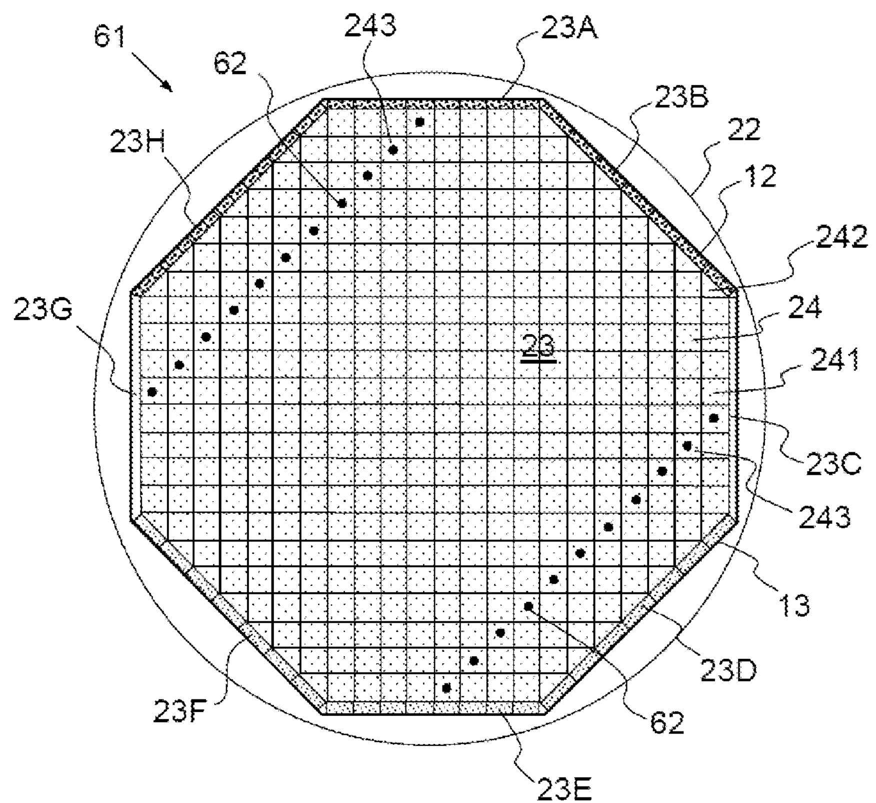
FIG.6
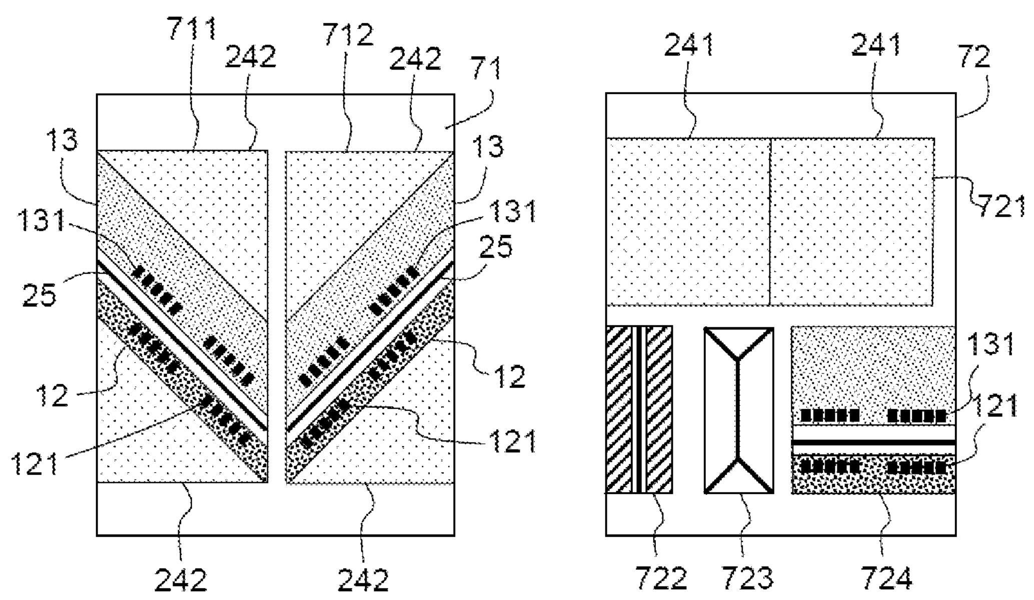
FIG.7A
FIG.7B

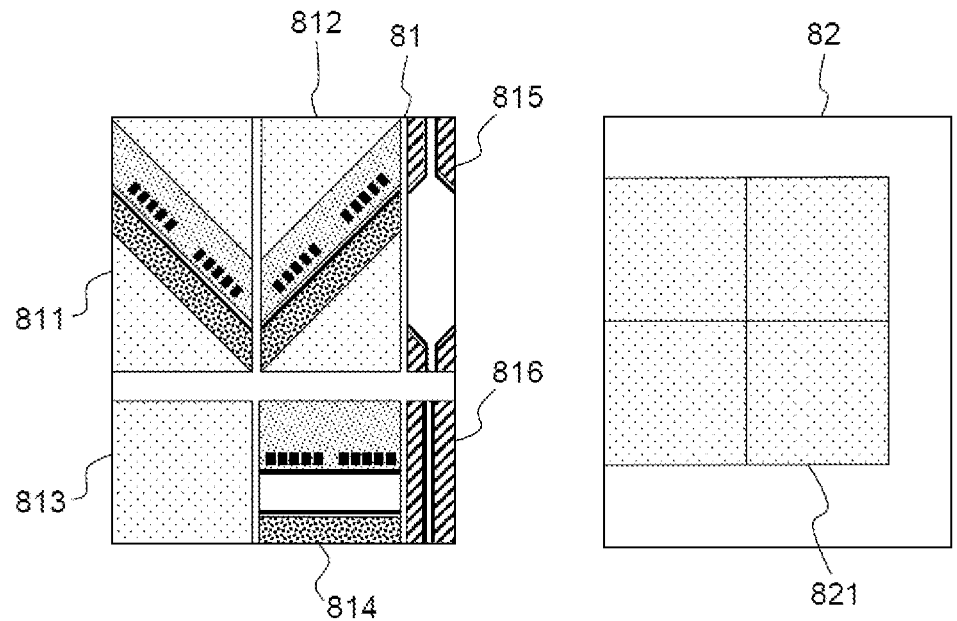
FIG.8A
FIG.8B
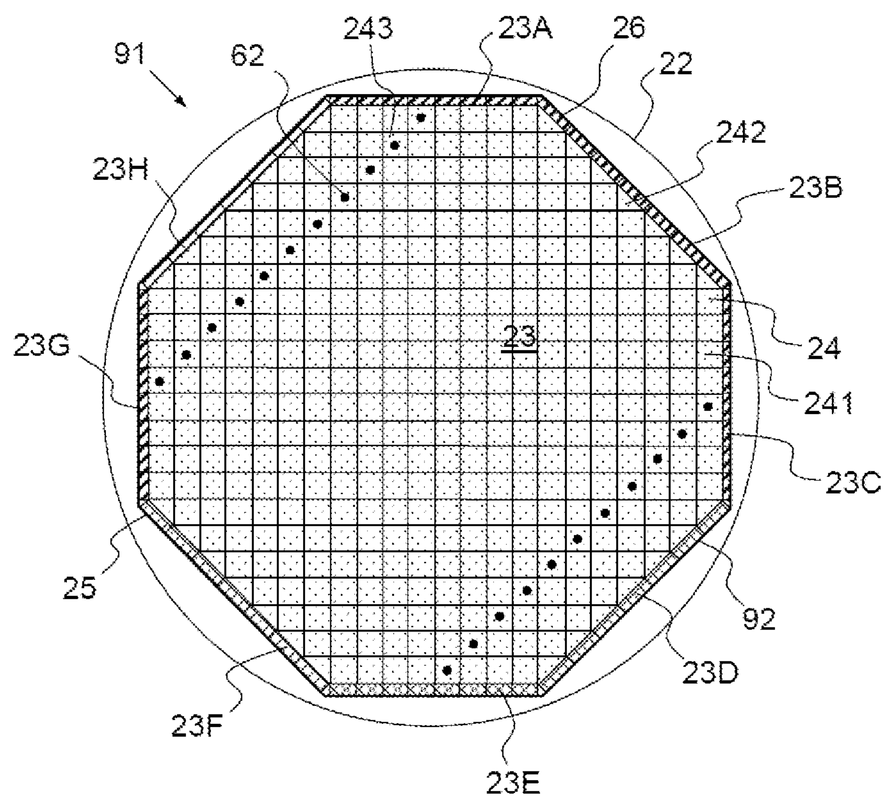
FIG.9

CMOS IMAGING DEVICE HAVING OPTIMIZED SHAPE, AND METHOD FOR PRODUCING SUCH A DEVICE BY MEANS OF PHOTOCOMPOSITION

CROSS-REFERENCE TO RELATED APPLICATIONS

This application is a National Stage of International patent application PCT/EP2013/064320, filed on Jul. 5, 2013, which claims priority to foreign French patent application No. FR 1256469, filed on Jul. 5, 2012, the disclosures of which are incorporated by reference in their entirety.

FIELD OF THE INVENTION

The invention lies in the field of digital imaging devices, notably devices intended for X-ray medical imaging. It relates to an imaging device comprising pixels addressed individually by addressing circuits. The invention also relates to a method for producing such an imaging device by photolithography.

BACKGROUND

A digital imaging device generally comprises an image sensor and processing means. Contemporary image sensors can be produced with the aid of various technologies often based on monocrystalline-silicon substrates, namely sensors using CCD ("Charge-Coupled Device") technology, MOS ("Metal Oxide Semiconductor") and CMOS ("Complementary MOS") sensors, but also for certain more specific applications regarding technologies based for example on thin layers of amorphous silicon (a-Si:H), or indeed other materials or substrates. Independently of the technology used, in each category, the image sensor comprises photosensitive dots, also called pixels, organized in rows and columns so as to form a matrix. Each pixel is able to convert the electromagnetic radiation to which it is exposed into electric charges and comprises a charge collector element collecting electric charges under the effect of an incident photon radiation. The electric charges can notably be generated by photosensitive elements associated with the charge collector elements. Traditionally the pixels comprise one or more photosensitive elements making it possible to detect electromagnetic radiation with a wavelength in the visible range or close to the visible range. In the medical field and in the industrial field, where X-ray or γ-ray radiations can be used, it is usual to interpose a radiation converter between the source of the radiation and the image sensor. Such a converter may for example be a scintillator or a photoconductor, respectively converting the incident electromagnetic radiation into a radiation of greater wavelength, typically that of visible light, or into electric charge. Stated otherwise, the scintillator emits photons under the effect of incident radiation while the photoconductor generates charge carriers under the effect of incident radiation. For these reasons the conversion by scintillator is commonly called indirect conversion and the conversion by photoconductor material, direct conversion (by reference to the electrical output signal).

In a CCD technology image sensor, the electric charges are read by being moved from pixel to pixel up to a charge reading circuit placed at an end of the matrix. In an image sensor produced on the basis of MOS or CMOS technological pathways, the means for reading the electric charges are in general partially integrated into the pixels. The conversion of the electric charges into electrical signals actually takes place inside the pixels. These electrical signals are read row by row at each end of the columns of pixels. For this purpose, each pixel comprises at least one element having a control or processing function (e.g. circuit breaker, reset, amplification) in addition to the photosensitive element or elements or to the charge collector element. In devices other than CCDs, the pixels are commonly classed into 2 large categories namely, on the one hand, passive pixels in which the charges are transferred outside the pixels without additional processing and, on the other hand, active pixels which integrate processing functions that are slightly more sophisticated locally at the level of the pixels (e.g. amplification). The image sensor also comprises row conductors linking the pixels row by row, and column conductors linking the pixels column by column. The row conductors are connected to an addressing circuit, also called a row addressing block, and the column conductors are connected to a reading circuit, also called a column reading block. The row addressing blocks and the column reading blocks are arranged at the periphery of the matrix, on two perpendicular sides. The row addressing block makes it possible to actuate the circuit breaker elements of the pixels row by row, and the column reading block makes it possible to read the electrical signals on the column conductors. The processing means of the imaging device make it possible to process the raw signals recovered on the column reading block.

In the field of X-ray imaging, image sensors employing MOS or CMOS technology are known but little used at this juncture, with the exception of the intra-oral dental field, notably because of the limited dimensions required for this application. This results from the marriage of two factors. The first factor is that the X-ray radiations cannot be focused over distances compatible with the applications, that is to say typically of the order of a meter. Consequently, the dimensions of the image sensor must be at least equal to those of the object to be imaged. The second factor is that MOS and CMOS image sensors are produced on silicon wafers whose dimensions are relatively restricted. These wafers mostly have a diameter of between 100 millimeters (mm) and 300 mm. A MOS or CMOS image sensor of rectangular shape produced on a silicon wafer therefore exhibits dimensions of markedly less than 300 mm. Thus, numerous organs of the human body cannot be imaged by such a sensor. Image sensors using silicon wafers of greater diameter would have a prohibitive cost. One solution consists in abutting several CMOS image sensors alongside one another in one or two directions, as is done with detection matrices employing amorphous silicon technology (a-Si:H). However, for the image sensors, the abutting of the pixels of a first sensor with those of a second sensor is heavily penalized, or indeed prevented on the sides where the row and/or column addressing blocks are situated, because of the difficulty of sensing a representative signal in this zone. Furthermore, the driving of the various sensors with one another is rendered complex. Another drawback of the production of rectangular-geometry MOS or CMOS image sensors on silicon wafers is that the zones of defects are generally denser when approaching the exterior edge of the wafers. It is therefore preferable to make an exclusion zone at the periphery of the silicon wafers, thereby further restricting the surface area utilized.

SUMMARY OF THE INVENTION

An aim of the invention is notably to remedy all or part of the aforementioned drawbacks by providing sensors employing MOS or CMOS technology, or any kin technology or one which is considered to be close or derived (e.g. BiCMOS for Bipolar-CMOS), using fabrication concepts whose geometry is optimized with respect to that of the silicon wafers on which they are produced. For this purpose, the subject of the invention is an imaging device comprising a monolithic sensor of surface area greater than or equal to 10 $cm^2$, the sensor comprising:

an image zone produced on a single substrate and comprising a group of pixels disposed in rows and columns, the number of pixels per column not being uniform for all the columns of pixels, each pixel comprising a charge collector element collecting electric charges generated as a function of a photon radiation received by the imaging device, row conductors linking the pixels row by row, column conductors linking the pixels column by column, row addressing blocks linked to the row conductors and making it possible to address each row of pixels individually, and column reading blocks linked to the column conductors and making it possible to read the electric charges collected by the pixels of the row selected by the row addressing blocks, the column reading blocks being situated at the periphery of the image zone, the row addressing blocks and the column reading blocks being produced on the same substrate as the image zone.

According to a particular form of production, at least two column reading blocks are contiguous with pixels belonging to rows of distinct ranks. Stated otherwise, not all the column reading blocks are mutually aligned along a single row parallel to the rows of pixels.

Advantageously, the number of pixels per column is adapted in such a way that the peripheral pixels of the image zone form substantially a polygon comprising at least 5 sides. The image zone thus exhibits a non-rectangular shape. The polygon preferably comprises a number less than 20 of sides so as to facilitate the production of the sensor and the cutting out thereof. In a particularly advantageous embodiment, the peripheral pixels of the image zone form substantially a regular octagon. For an image zone of polygonal shape, the column reading blocks can be clustered together in groups, each group being parallel to one of the sides of the polygon.

In particular, the column reading blocks of a first group can be situated on a first side of the regular octagon, the column reading blocks of a second group can be situated on a second side adjacent to the first, and the column reading blocks of a third group can be situated on a third side adjacent to the second side.

The row addressing blocks can be situated at the periphery of the image zone. In particular, they can be situated on sides of the regular octagon that are opposite the first, the second and the third side, the row conductors being formed on a first metallic face or layer of the substrate, the sensor comprising, furthermore, control buses formed on a second metallic face or layer of the substrate and metallized holes formed in the image zone, the control buses being oriented parallel to the columns of pixels and being linked to the row addressing blocks, and the metallized holes linking each row conductor to one of the control buses. In another embodiment, the row addressing blocks are situated on the same sides of the regular octagon as the column reading blocks, the row conductors being formed on a first metallic face or layer of the substrate, the sensor comprising, furthermore, control buses formed on a second metallic face or layer of the substrate and metallized holes formed in the image zone, the control buses being oriented parallel to the columns of pixels and being linked to the row addressing blocks, the metallized holes linking each row conductor to one of the control buses.

According to another embodiment, the column reading blocks are situated on a part of a first side of the regular octagon, on a second side adjacent to the first side, on a part of a third side opposite the first side, and on a fourth side opposite the second side, the parts of the first and third sides being complementary so as to allow the reading of each of the columns of pixels of the image zone, the row addressing blocks being situated on a part of a fifth side adjacent to the second side, on a sixth side adjacent to the third and fifth sides, on a part of a seventh side opposite the fifth side, and on an eighth side opposite the sixth side, the parts of the fifth and seventh sides being complementary so as to allow the addressing of each of the rows of pixels of the image zone.

The row addressing blocks can also be situated inside the image zone. In particular, the row addressing blocks can be adjacent to one of the columns of pixels comprising the largest number of pixels.

According to another embodiment, the row addressing blocks are situated at the periphery of the image zone, some row addressing blocks being parallel to the rows of pixels and some row addressing blocks being inclined with respect to the rows and to the columns of pixels, the row conductors being formed on a first metallic face or layer of the substrate, the sensor comprising, furthermore, control buses formed on a second metallic face or layer of the substrate and metallized holes 62 formed in the image zone, the control buses being oriented parallel to the columns of pixels and being linked to the row addressing blocks, the metallized holes linking each row conductor to one of the control buses.

According to another embodiment, the column reading blocks and the row addressing blocks are situated at the periphery of the image zone, parallel to the rows of pixels, the row conductors being formed on a first metallic face or layer of the substrate, the sensor comprising, furthermore, control buses formed on a second metallic face or layer of the substrate and metallized holes formed in the image zone, the control buses being oriented parallel to the columns of pixels and being linked to the row addressing blocks, the metallized holes linking each row conductor to one of the control buses.

According to another embodiment, each column reading block is parallel to the rows of pixels, a part of the column reading blocks being situated at a first end of the columns of pixels and another part being situated at a second end of the columns of pixels, the two parts being complementary so as to allow the reading of each of the columns of pixels of the image zone, the row addressing blocks being situated at the periphery of the image zone, parallel to the columns of pixels, a part of the row addressing blocks being situated at a first end of the rows of pixels and another part being situated at a second end of the rows of pixels, the two parts being complementary so as to allow the addressing of each of the rows of pixels of the image zone.

The peripheral pixels of the image zone can also form substantially a convex hexagon a first side of which is parallel to the rows of pixels, a second and a third side of which, both adjacent to the first side, are parallel to the columns of pixels, a fourth and a fifth side of which, respectively adjacent to the second and to the third side, are inclined with respect to the rows and to the columns of pixels, and a sixth side of which, adjacent to the fourth and to the fifth side, is parallel to the rows of pixels.

Each pixel of the sensor comprises for example a photosensitive element generating electric charges as a function of a radiation received by the imaging device.

A scintillator can be coupled optically to the sensor so as to convert an X-ray or gamma-ray radiation into a radiation to which the photosensitive elements are sensitive.

Instead of a photosensitive element, each pixel can comprise an electrode for collecting electric charges forming at least one part of the charge collector element. A photoconductor can then be coupled electrically to the electrodes for collecting charges of the pixels of the sensor, the photoconductor making it possible to convert an X-ray or gamma-ray radiation into electric charges. The photoconductor is for example made of cadmium telluride (CdTe), of a compound comprising telluride, cadmium and zinc ($Cd_xTe_yZn_z$), of gallium arsenide (AsGa), of mercury iodide ($HgI_2$), of lead oxide (PbO), of lead iodide ($PbI_2$), or of selenium (Se).

Each row addressing block and each column reading block can comprise connection pads able to link the row conductors and the conductors of columns to external circuits, said connection pads being aligned in each block in one or more lines. The connection pads of each block are preferably aligned with the edges of the substrate.

The invention also pertains to a method for producing by photolithography an imaging device on a semi-conducting wafer forming a substrate; the sensor comprising:

an image zone produced on the substrate and comprising a group of pixels disposed in rows and columns, the number of pixels per column not being uniform for all the columns of pixels, each pixel comprising a charge collector element collecting electric charges generated as a function of a photon radiation received by the imaging device, row conductors linking the pixels row by row, column conductors linking the pixels column by column, row addressing blocks linked to the row conductors and making it possible to address each row of pixels individually, and column reading blocks linked to the column conductors and making it possible to read the electric charges collected by the pixels of the row selected by the row addressing blocks, the column reading blocks being situated at the periphery of the image zone, the row addressing blocks and the column reading blocks being produced on the same substrate as the image zone;

the method being characterized in that it comprises a step in which a surface of the semi-conducting wafer is exposed zone by zone to a radiation through at least one set of masks; the at least one mask set being configured to be able to produce, by photolithography, various patterns on the surface of the semi-conducting wafer; the image zone being obtained by the successive production of patterns, adjacent to one another, on the surface of the semi-conducting wafer; the image zone thus obtained exhibiting a surface area of greater than or equal to 10 $cm^2$;

the method also being characterized in that the number of patterns implemented is strictly greater than 1 and less than 15.

Advantageously, the number of patterns implemented is less than 8. This makes it possible to limit the operations of photorepetitions implemented for a part of the photolithography method required for the production of the imaging device.

Advantageously, the number of sets of masks implemented is less than 3. The cost associated with each set of masks being high, it is appropriate to limit the number of sets of masks implemented.

Advantageously, each mask of a mask set comprises n distinct regions, allowing respectively the production, by photolithography, of n patterns. n is an integer, preferably lying between 1 and 15 and preferably lying between 1 and 10.

The image zone can be obtained by the production of patterns formed by means of two or three sets of masks. This number is at one and the same time sufficiently low to limit the overall cost of industrialization, and sufficiently sizeable to avoid multiplying the number of zones of small surface area on each of the masks, and therefore the number of photorepetitions required for the production of a sensor of large dimension.

Thus, the wafer being divided into elementary zones, the method consists in constructing, by photolithography, a pattern on each elementary zone, doing so zone by zone. The patterns constructed on adjacent zones are interconnected, so as to construct the image zone.

Stated otherwise, the image zone is produced by photocomposition, by combining various photolithography operations so as to construct various adjacent patterns. The structure of these patterns allows their interconnection.

Advantageously, the peripheral pixels of the image zone form substantially a polygon comprising at least 5 sides.

Advantageously, the peripheral pixels of the image zone form substantially a polygon comprising a number less than 20 of sides.

In a particularly advantageous implementation, the peripheral pixels of the image zone form substantially a regular octagon.

Each row addressing block of the sensor can be formed by the production of a pattern comprising a region corresponding to said row addressing block, at least one of the patterns forming a row addressing block exhibiting shapes inclined with respect to the rows and to the columns of pixels.

Likewise, each column reading block of the sensor can be formed by the production of a pattern comprising a region corresponding to said block, at least one of the patterns forming a column reading block exhibiting shapes inclined with respect to the rows and to the columns of pixels.

Advantageously, the set or sets of masks are of rectangular shape; each pattern to be produced on the semi-conducting wafer being selected by one or more obturation flaps.

The surface of the semi-conducting wafer can be exposed through a set of masks, each mask of which comprises a region making it possible to form a cutting line surrounding the image zone, the row addressing blocks and the column reading blocks; the cutting line facilitating the cutting of the semi-conducting wafer. The method can then also furthermore comprise a step of cutting the semi-conducting wafer along the cutting line to form the sensor.

The invention exhibits particular interest in the field of imaging by ionizing radiation where the objects exhibit a substantially circular or semi-circular shape, for example a heart or a breast. It then exhibits the advantage of more considerably utilizing the surface of the silicon wafer on which the sensor is produced.

BRIEF DESCRIPTION OF THE DRAWINGS

The invention will be better understood and other advantages will become apparent on reading the description which follows, offered in relation to the appended drawings in which:

FIG. 2 represents a first exemplary embodiment of a sensor according to the invention;

FIGS. 3A and 3B schematically represent a first example of sets of masks making it possible to produce the sensor of FIG. 2;

FIG. 4 represents a second exemplary set of masks making it possible to produce the sensor of FIG. 2;

FIGS. 5A and 5B represent a third example of sets of masks making it possible to produce the sensor of FIG. 2;

FIG. 6 represents a second exemplary embodiment of a sensor according to the invention;

FIGS. 7A and 7B represent a first example of sets of masks making it possible to produce the sensor of FIG. 6;

FIGS. 8A and 8B represent a second example of sets of masks making it possible to produce the sensor of FIG. 6;

FIG. 9 represents a third exemplary embodiment of a sensor according to the invention;

DETAILED DESCRIPTION

Figure 1:
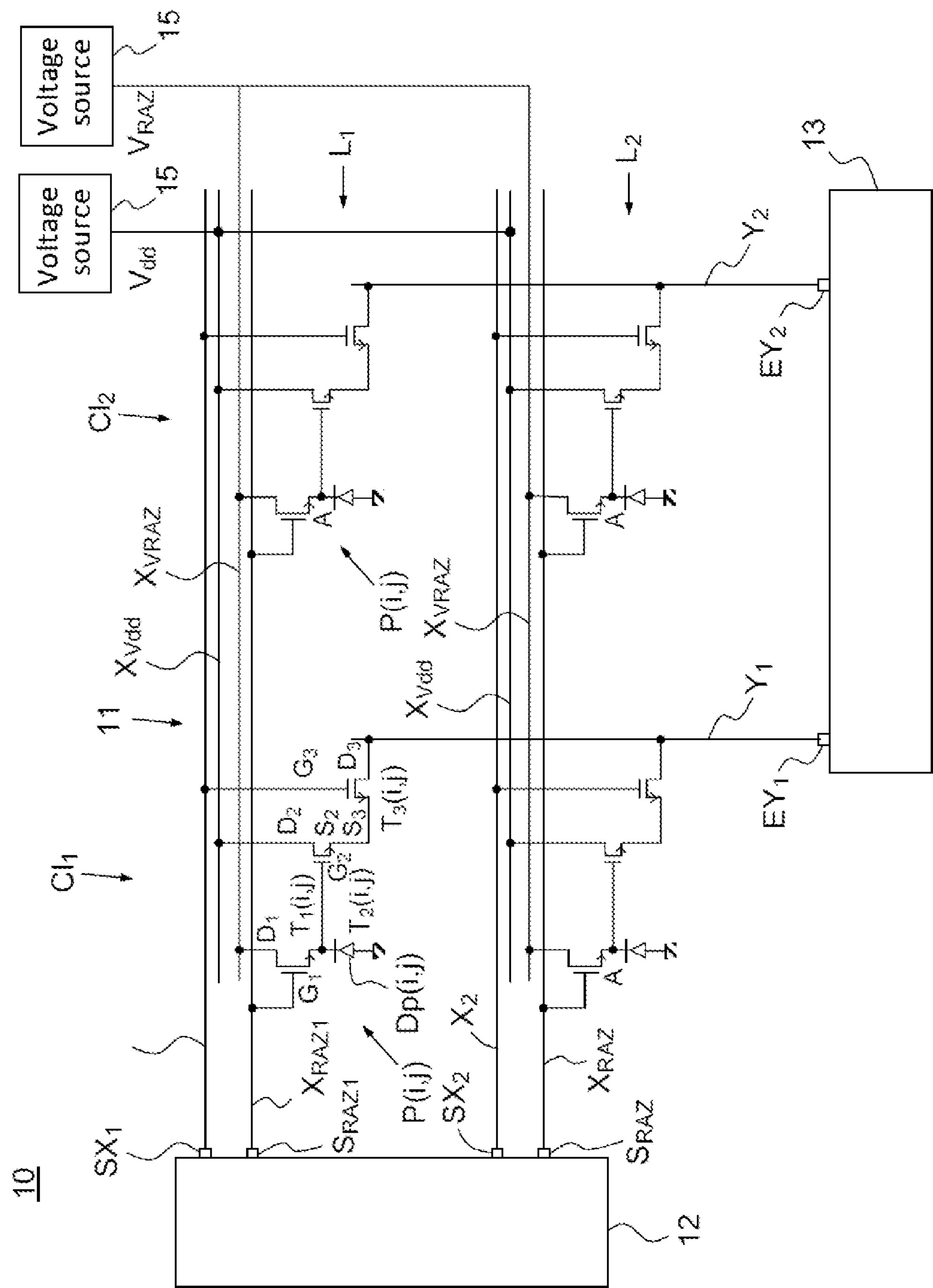
FIG. 1 represents in the form of a functional diagram an exemplary CMOS image sensor on which the invention relies.

Generally, the invention relates to a sensor integrated into a digital imaging device and comprising a group of pixels disposed in rows and/or columns, row addressing blocks, column reading blocks, row conductors linking the rows of pixels to a row addressing block, and column conductors linking the columns of pixels to a column reading block. It should be noted that, within the framework of the present patent application, the notions of column and row have only a relative sense, a row of pixels and a column of pixels merely being lines of pixels typically arranged perpendicularly to one another. A row conductor, respectively column conductor, is defined as being oriented parallel to a row of pixels, respectively a column of pixels. The whole group of pixels of a sensor forms an image zone. Each pixel comprises a charge collector element making it possible to collect electric charges induced upon receiving photons on a radiation converter of the imaging device. The conversion of photons into electric charges can either be ensured locally in the pixel with the aid of one or more photosensitive elements (e.g. photodiode, photoMOS, etc.), or sited remotely, for example a photoconducting layer deposited directly on the sensor or coupled electrically by any connection technique (e.g. bump bonding, etc.). A radiation converter of the scintillator style may or may not be integrated into the pixels of the sensor. When the radiation converter is integrated, the sensor is dubbed an image sensor, and the image zone can be called the photosensitive zone. The photosensitive elements of an image sensor are for example photodiodes or phototransistors. They generate electric charges upon receiving a photon radiation, generally in the visible range. In the case where the imaging device is intended for imaging by X-ray or γ-ray radiation, the imaging device can comprise a scintillator associated with the image sensor so as to convert the radiation into a radiation to which the photosensitive elements are sensitive. The invention also applies to sensors not comprising any photosensitive elements. In such sensors, the radiation converter can consist of a photoconductor arranged on the sensor. Each pixel comprises for example an electrode for collecting electric charges and a storage capacitor. The photoconductor is connected nominally to each electrode for collecting charges of the pixels of the sensor, so that the electric charges arising from the conversion of the X-ray or γ-ray radiation are collected locally in the pixels. The row addressing blocks make it possible to address each row of pixels individually by way of the row conductors. They are dimensioned so as to each address one or preferably several rows of pixels. The addressing of a row of pixels consists in controlling one or more actuators in each of the pixels of the row. It comprises for example the injection of a so-called reading signal onto a row conductor so as to control the reading of the electric charges collected in the pixels of this row. The addressing of a row of pixels can also comprise the injection of a so-called reset to zero signal onto the same row conductor or onto another row conductor so as to control the resetting to zero of the pixels of this row, that is to say the restoration of an initial quantity of charges. The column reading blocks generally make it possible to read in parallel on the column conductors the pixels of the row selected by the row addressing blocks. They are also dimensioned to each read one or preferably several columns of pixels. The reading of a pixel situated at the intersection of a column and of the row selected by the row addressing block comprises the reception on the column conductor to which it is linked of a signal representative of the quantity of charges present in this pixel, itself proportional to the level of illumination of this pixel. At the present time, sensors comprising pixels addressed both by row addressing blocks and column reading blocks are produced notably in CMOS technology on silicon substrates, generally in the form of circular wafers.

According to a first aspect of the invention, the sensor comprises a non-uniform number of pixels per column (the technical difficulty to be surmounted being related to the fact that the pixels are "composed" by a block lithography technique). Stated otherwise, the columns of pixels do not all necessarily comprise the same number of pixels. As a consequence, neither is the number of pixels per row uniform for all the rows. The number of pixels per column and per row can notably be adapted in such a way that a part of the peripheral pixels of the sensor form substantially a conical curve such as a circle or a semicircle. The number of pixels per column and per row can also be adapted in such a way that the image zone of the sensor forms a polygon other than a quadrilateral. In particular, the image zone can form a polygon with more than four sides. Preferably, the polygon is convex and regular. It preferably comprises a number less than 20 of sides, so as to facilitate the cutting of the sensor, according to a cut line arranged on the substrate. It is for example an octagon, which exhibits a good compromise between the number of sides and the fill factor over a circular area. The octagon furthermore presents the advantage of comprising only sides parallel to the rows of pixels, sides parallel to the columns of pixels, and sides inclined at 45° with respect to the rows and to the columns of pixels. The latter aspect facilitates the process for fabricating the sensor by photocomposition. The pixels generally have a square or at least rectangular shape, and identical dimensions. Thus, the shape of the sensor can be determined to within a pixel, that is to say by arranging the pixels so as to obtain the contour closest to the desired shape. Certain pixels at the periphery can also have a different shape so as to approximate more faithfully the desired sensor shape. The shape of the sensor can also be approximated to within several rows or columns of pixels. Stated otherwise, several contiguous rows of pixels and several contiguous columns of pixels can comprise one and the same number of pixels so as globally to approximate the desired sensor shape. In particular, the number of rows and of columns of pixels comprising one and the same number of pixels can be adapted to the dimension of the row addressing blocks and to that of the column reading blocks. However, it is preferable to produce a sensor whose shape approximates the desired shape as precisely as possible. Indeed, the presence of notches involves sizeable discontinuities in the length of the row and column conductors, and therefore the presence of artifacts in the images. This is manifested by a discontinuity in the black image, that is to say the image obtained in the absence of any incident beam, this being prejudicial to the spatial homogeneity of the noise.

According to a second aspect of the invention, the sensor exhibits a large surface area, in this instance at least greater than or equal to 10 $cm^2$, but preferably greater than or equal to 100 $cm^2$, or indeed greater than or equal to 200 $cm^2$. The sets of masks or reticles used in current photolithography methods having considerably smaller dimensions, of the order of a few square centimeters, the sensor is thus formed on a semi-conducting wafer by a method of composed photolithography, also called photocomposition or "stitching" in the literature. Stated otherwise, the sensor is formed by several exposures of a semi-conducting wafer through one or more masks (each of the exposures comprising a multitude of elements of the sensor, for example several tens, hundreds, or indeed thousands of pixels in the case of photocomposition of the matrix zone). This second aspect can also be expressed by the fact that the sensor according to the invention exhibits at least one metallic bus, for example a row or column conductor, whose length is greater than or equal to 50 mm, that is to say greater than the largest dimension of the masks currently used in photolithography methods.

Combining the first and second aspects of the invention makes it possible to produce CMOS sensors with a large surface area and exhibiting a very attractive area to cost ratio. In particular, the replacement of a radiological image-intensifier tube 9 inches (about 230 mm) in diameter by a CMOS sensor of square shape in which a circle of this dimension can be inscribed requires the abutting of several circuits each produced in a silicon wafer 200 or 300 mm in diameter. On the other hand, it is perfectly possible to produce a shape containing a circle 230 mm in diameter in a single wafer of like dimension. Thus, the invention proposes notably to produce CMOS sensors whose shape approximates that of a circle on the basis of a single semi-conducting wafer.

According to a third aspect of the invention, the row addressing blocks and the column reading blocks are produced on one and the same substrate as the pixels. Indeed, it is necessary for the pixels, the addressing blocks and the reading blocks to be produced on the same substrate, so as to avoid technological difficulties of linkup when two substrates are employed, one carrying the pixels, the other carrying the reading and/or addressing blocks.

According to a particular form of production of the invention, the device comprises connection pads, produced on the substrate, intended for linkup to external circuits, these latter being for example dedicated to power supply, synchronization or processing of the signals collected. The connection of the sensor with external circuits, for example processing means, can thus be easily achieved. The connection pads can be produced in the row addressing blocks and the column reading blocks. The blocks are then preferably arranged at the periphery of the substrate. Advantageously, the connection pads are arranged at the periphery of the substrate, at a distance of less than 5 millimeters from the edge of the substrate, or from the cut line arranged in the substrate. Typically, they are arranged at a distance of between 10 micrometers and 500 micrometers. When the sensor exhibits a polygonal shape, the connection pads are preferably aligned with the edges of the substrate, in one or more lines. The connection pads have for example a rectangular shape with sides of length lying between 50 micrometers (μm) and 70 μm, and sides of length lying between 150 μm and 210 μm. These characteristics make it possible to facilitate the connection with the previously mentioned external circuits.

FIG. 1 is a functional diagram of an exemplary CMOS image sensor on which the invention relies. The image sensor 10 comprises a matrix 11 of two rows $L_1$ and $L_2$ by two columns $Cl_1$ and $Cl_2$ of pixels $P_1$ to $P_4$. In the present exemplary sensor, the pixels comprise photosensitive elements and are therefore also called "photosensitive dots". The matrix 11 being able to comprise any number of rows and columns, the pixels are denoted in the generic form P(i,j), where i and j are natural integers designating respectively the row rank and the column rank in the matrix 11. The image sensor 10 furthermore comprises a row addressing block 12, a column reading block 13, row conductors $X_i$, $X_{RAZi}$, $X_{Vdd}$ and $X_{VRAZ}$, and column conductors $Y_j$. The row addressing block 12 comprises at the minimum two connection points $SX_i$ and $S_{RAZi}$ for each row i of pixels P(i,j). Each connection point $SX_i$ is connected to the corresponding row conductor $X_i$ and each connection point $S_{RAZi}$ is connected to the corresponding row conductor $X_{RAZi}$. A pixel P(i,j) comprises a photodiode Dp(i, j) and three transistors $T_1$(i,j), $T_2$(i,j) and $T_3$(i,j). The photodiodes Dp(i,j) can naturally be replaced with any photosensitive element able to generate electric charges under photon radiation. The first transistor $T_1$(i,j) is linked by its gate $G_1$ to the row conductor $X_{RAZi}$ of the row i, by its drain $D_1$ to the row conductor $X_{VRAZ}$, and by its source $S_1$ to the cathode of the photodiode Dp(i,j). The anodes of all the photodiodes Dp(i,j) are linked to a common potential, for example ground. The connection point between the source $S_1$ of the transistor $T_1$(i, j) and the cathode of the photodiode Dp(i,j) is called the floating point A. The transistor $T_2$(i,j) is linked by its gate $G_2$ to the floating point A, by its drain $D_2$ to the row conductor $X_{Vdd}$ and by its source $S_2$ to the source $S_3$ of the transistor $T_3$(i,j). The gate $G_3$ of the transistor $T_3$(i,j) is linked to the row conductor $X_i$ and its drain $D_3$ is linked to the column conductor $Y_j$. All the row conductors $X_{VRAZ}$ are subjected to one and the same potential, called the reset to zero potential $V_{RAZ}$. This potential is for example provided by a voltage source 14. In an analogous manner, all the row conductors $X_{Vdd}$ are subjected to one and the same potential, called the power supply potential $V_{dd}$. This potential is for example provided by a voltage source 15. The row addressing block 12 can furthermore comprise elements making it possible to generate the signals to be injected onto the row conductors $X_i$ and $X_{RAZi}$. This entails for example a clock and shift registers. The column reading block 13 comprises at the minimum a connection point $EY_j$ for each column conductor $Y_j$. It can furthermore comprise elements making it possible to process the signals received on the column conductors $Y_j$. In particular, this can entail a multiplexer, an amplifier and/or an analog-digital converter.

The transistors $T_1$(i,j) make it possible to reinitialize the potential of the cathode of the photodiodes Dp(i,j) to the reset to zero potential $V_{RAZ}$. In particular, when the signal injected onto the row conductor $X_{RAZi}$ of a row i is active, the potential of the floating point A of all the photodiodes Dp(i,j) of the row i is reinitialized to the potential $V_{RAZ}$. The transistors $T_2$(i,j) operate in follower mode and the transistors $T_3$(i,j) make it possible to select the row i of pixels P(i,j) for which it is desired to read the quantity of electric charges accumulated at the floating point A. When the signal injected onto the row conductor $X_i$ of a row i is active, the potential of the floating points A is copied, to within a shift voltage, over to the corresponding column conductor $Y_j$. The image sensor 10 operates in the following manner. During an image capture phase, preferably occurring after an operation of resetting the potential of the floating points A to zero, the exposure of the photodiodes Dp(i,j) to radiation generates electric charges at the level of the floating points A. The quantity of charges at the level of each floating point A is generally proportional to the intensity of the radiation received by the pixel P(i,j) considered. The image capture phase is followed by a reading phase performed row by row. The signals injected on the various row conductors pass successively to the active state, so that the potential of each column conductor $Y_j$ is successively representative of the quantity of electric charges accumulated in the various pixels P(i,j) of the column j.

FIG. 2 represents a first exemplary embodiment of a sensor according to the invention. This sensor 21 is produced on a semi-conducting wafer 22 of circular shape forming a substrate. The sensor 21 comprises a photosensitive zone 23 formed of a group of pixels 24 abutted to one another, so forming rows and columns, row addressing blocks 12, and column reading blocks 13. The row conductors, not represented, link each row of pixels 24 to one of the row addressing blocks 12. The column conductors, not represented, link each column of pixels 24 to one of the column reading blocks 13. In this first exemplary embodiment, the photosensitive zone 23 forms a regular octagon. The sides of the octagon are denoted consecutively 23A to 23H, the side 23A being a side parallel to the rows of pixels 24. The photosensitive zone 23 comprises pixels 241 of square shape, and pixels 242 of triangular shape. Note that one speaks here of triangular pixel, knowing that in practice these pixels 242 of so-called triangular shape are in reality a cluster of pixels in which each pixel has a quadrilateral shape but the cluster of pixels has a substantially triangular shape, one of the sides being staircase-shaped. The designation triangular pixel is therefore understood as a triangular pixel cluster. In particular, the pixels 242 have an isosceles right-angled triangle shape. The pixels at the periphery of the photosensitive zone 23 are square pixels 241 when they are situated on the sides parallel to the rows or to the columns of pixels 24, that is to say on the sides 23A, 23C, 23E and 23G, and triangular pixels 242 when they are situated on sides inclined with respect to the rows and to the columns of pixels 24, that is to say on the sides 23B, 23D, 23F and 23H. The triangular pixels 242 are oriented so as to allow the photosensitive zone 23 to best approximate the shape of an octagon. All the other pixels 24 are square pixels 241. In view of FIG. 2, it is clearly apparent that the row addressing blocks 12 and the column reading blocks 13 cannot be simply arranged at the periphery of the photosensitive zone 23 in two mutually perpendicular rows. Such an arrangement would require a wafer 22 of considerably greater diameter than the diameter of the circle in which the photosensitive zone 23 is inscribed. In this first exemplary embodiment, the row addressing blocks 12 are actually situated inside the photosensitive zone 23. They form a column arranged between two columns of pixels 24 and extending between the sides 23A and 23E of the octagon. This arrangement exhibits the advantage of allowing all the blocks 12 to be mutually aligned. On the other hand, the photosensitive zone 23 exhibits a discontinuity liable to be perceived on the images. The column reading blocks 13 are situated at the periphery of the photosensitive zone 23, on the sides 23D, 23E and 23F of the octagon. On each of these sides, the blocks 13 are mutually aligned, so as to follow the octagonal shape. Certain column reading blocks 13 are therefore inclined with respect to the rows and to the columns of pixels 24. The blocks 12 and 13 comprise at the minimum connection pads making it possible to connect the row and column conductors with exterior circuits. The connection pads of the row addressing blocks 12 are for example formed by metallized holes, also called "vias", allowing connections through the face of the semi-conducting wafer 22 opposite the face on which the pixels 24 are formed. The column reading blocks 13 can comprise, in addition to connection pads, circuits for processing the signals received on the column conductors. These circuits can be arranged on the same face of the semi-conducting wafer 22 as that on which the pixels 24 are formed, or on the opposite face. In an optional manner, a cutting line 25 surrounding the photosensitive zone 23 and the column reading blocks 13 can be formed on the semi-conducting wafer 22. This cutting line 25, designated by the expression "die seal ring", can be produced by a stack of metallic layers locally strengthening the semi-conducting wafer and thus facilitating the cutting out of the sensor 21. The cutting line 25 thus forms the edge of the sensor 21. The sensor 21 can also comprise routing blocks 26 on the sides of the photosensitive zone 23 that are left free by the column reading blocks 13. In this instance, these routing blocks 26 can be arranged on the sides 23A, 23B, 23C, 23G and 23H. The routing blocks 26 can notably be used to connect power supply lines, for example the row conductors $X_{VRAZ}$ and $X_{Vdd}$ of the image sensor 10 represented in FIG. 1.

It should be noted that, in the exemplary sensor 21 described hereinabove, as well as in the exemplary sensors described hereinbelow, the pixels 24 are represented by geometric shapes, namely squares or triangles. However, this is just a schematic representation. The pixels 24 correspond for example to the pixels P(i,j) described with reference to FIG. 1. Thus, even if the surface of a pixel is mainly occupied by its photosensitive element, it is also occupied by other elements, in this instance transistors and segments of conductors. Nonetheless, each pixel can be designed so as to be inscribed substantially within the desired shape. Moreover, it has been considered that each geometric shape corresponds to a single pixel. However, each square and each triangle can comprise a plurality of pixels. In this case one speaks of blocks of pixels. By way of example, each element designated by the reference 241 in FIG. 2 can comprise a block of two rows by two columns of pixels, such as the matrix 11 of FIG. 1, or a block of 64×64 pixels. Each element designated by the reference 242 can comprise a block of pixels of identical dimensions which are arranged so as to form a triangle. Moreover, in the various examples of sensors described in the present patent application, each row addressing block 12 is represented as addressing a single row of pixels or, if appropriate, a single row of blocks of pixels. However, here again this is a simple representation. One and the same row addressing block 12 can address several rows of pixels or several rows of blocks of pixels. In the particular case of the sensor 21, the same addressing block 12 can address all the rows of pixels of the photosensitive zone 23. Likewise, a column reading block 13 can address several columns of pixels or several columns of blocks of pixels.

For the subsequent description, a device through which radiation can pass in such a way as to reproduce a pattern on a zone of a semi-conducting wafer is called a set of masks or reticle. Typically, the semi-conducting wafer is coated with a photosensitive resin and the radiation used possesses a wavelength in the ultraviolet range. The sets of masks or reticles have a rectangular shape with dimensions for example of the order of 26 mm by 32 mm. To produce a pattern on the semi-conducting wafer, at least one set of masks comprising several masks is employed. Each mask of one and the same set of masks defines a delimited spatial zone, corresponding to the zone of projection of the radiation through the mask and onto the photosensitive wafer.

The projection of the radiation through a mask allows the production of a part of the pattern to be produced. The pattern is thus produced by photolithography, by means of successive exposures through the various masks of a mask set. Stated otherwise, a pattern is formed on the semi-conducting wafer by successive exposures, each of which allows the production of a technological level; these technological levels being able to correspond for example to an N or P implantation level, a deposition of oxide or polysilicon, or of metal oxide. The stacking of these technological levels obtained on completion of the successive exposures through the masks of the set of masks makes it possible to obtain an operational pattern on a zone of the semi-conducting wafer. It goes without saying that between each exposure, microtechnological methods of deposition, etching, dissolution, etc. type can be implemented.

The image zone eventually defining the surface of the photographic sensor is obtained by reproducing on the surface of the semi-conducting wafer one or more patterns adjacent to one another. Stated otherwise, the patterns are intended to be interconnected so as to constitute the image zone. This interconnection between the patterns constitutes a particular difficulty solved by the present invention, as described hereinafter.

Note also that in the photolithography method implemented, the masks of one and the same set of masks can be partially obturated in the same manner by obturation flaps so as to delimit the zone of projection of the set of masks. By way of this partial obturation of the set of masks, it is envisaged that one and the same set of masks can be configured to enable several patterns to be produced.

Stated otherwise, to produce a pattern, each mask of one and the same mask set comprises a delimited region dedicated to this pattern. During the production of said pattern on the wafer, each mask of the set of masks is obturated, in such a manner that said region is exposed. Thus, each mask of one and the same mask set can comprise several regions, each region corresponding to a particular pattern.

This implementation is particularly advantageous since the high cost of a set of masks or reticle constitutes a design constraint for a sensor of large dimension. It is appropriate to limit the number of sets of masks required for the production of the sensor. The present invention makes it possible advantageously to optimize this number of sets of masks while offering high flexibility of design for a sensor of large dimension and exhibiting a complex geometry.

FIGS. 3A and 3B schematically represent a first example of sets of masks making it possible to produce the sensor 21 of FIG. 2. FIG. 3A corresponds to a first set of masks and FIG. 3B to a second set of masks. The first set of masks 31 is able to constitute two patterns 311 and 312. In the subsequent description, FIGS. 3A, 3B, 4, 5A, 5B, 7A, 7B, 8A, 8B, 10A, 10B, 12A, 12B, 12C, 14A, 14B, 16 represent patterns which are capable of being produced by sets of masks. It is understood that each of these figures represents the pattern able to be produced on the wafer by photolithography, by implementing a set of masks. The pattern 311 comprises an upper part and a lower part which are separated by a cutting line 25 segment. The upper part corresponds to the side 23F of the photosensitive zone 23. It comprises a region making it possible to form a triangular block of pixels, as well as a region making it possible to form the column reading block 13 associated with this block of pixels. The column reading block 13 comprises connection pads 131 aligned in the neighborhood of its exterior edge, that is to say in proximity to the cutting line 25 segment, parallel to the cutting line 25 segment. In this exemplary embodiment, the connection pads 131 are aligned along a single rank. However, they could also be aligned along several ranks, preferably all parallel to the cutting line 25 segment. The lower part corresponds to the side 23B of the photosensitive zone 23. It comprises a region making it possible to form a triangular block of pixels, as well as a region making it possible to form a routing block 26. The blocks 13 and 26 of the pattern 311 extend along axes inclined with respect to the rows and to the columns of pixels. The pattern 312 is intended to form the sides 23D and 23H of the photosensitive zone 23. It exhibits an axial symmetry with respect to the pattern 311.

Thus, each mask of the set of masks 31 comprises two distinct regions allowing respectively the production, by photolithography, of two patterns 311, 312.

The axis of symmetry being an axis parallel to the columns of pixels. The second set of masks 32 is able to constitute five patterns 321 to 325. The first pattern 321 is intended to form a square pixel 241 or, if appropriate, a square block of pixels. The pattern 322 comprises an upper part and a lower part which are separated by a cutting line 25 segment parallel to the rows of pixels. The upper part corresponds to the side 23E of the photosensitive zone 23. It comprises a region making it possible to form a column reading block 13, and notably connection pads 131 aligned with the cutting line 25 segment. The lower part corresponds to the side 23A and comprises a part making it possible to form a routing block 26. The blocks 13 and 26 of the pattern 322 extend parallel to the rows of pixels. The pattern 323 comprises a region making it possible to form a routing block 26 on either side of a segment of the cutting line 25. It makes it possible to form the sides 23C and 23G of the photosensitive zone 23. The pattern 324 is intended to form the junctions of the cutting line 25 between the various sides of the polygon. The pattern 325 comprises a region making it possible to form a square block of pixels, and a region making it possible to form a row addressing block 12 adjoining one of the sides of the pixel 241 that are parallel to the columns of pixels. One of the particular features of the sets of masks 31 and 32 is that they are adapted to the production of patterns exhibiting shapes inclined with respect to the rows and to the columns of pixels of the photosensitive zone 23. Thus, it is possible to produce a photosensitive zone whose contours are inclined with a set of masks of rectangular shape. This advantage takes on a particular importance insofar as current lithography methods do not make it possible to orient the masks with respect to the semi-conducting wafer 22.

It is noted that each mask of the set of masks 32 comprises five distinct regions allowing respectively the production, by photolithography, of five patterns 321, 322, 323, 324, 325.

FIG. 4 represents a second exemplary set of masks making it possible to produce the sensor 21 of FIG. 2. This set of masks 41 is used with the set of masks 31 of FIG. 3A. It is able to produce six patterns 411 to 416. The first pattern 411 makes it possible to form two square blocks of pixels 241. The second pattern 412 is identical to the pattern 322 corresponding set of masks 32. The patterns 413 and 414 have a structure identical to the patterns 323 and 324 but exhibit a smaller width. The pattern 415 corresponds to a row addressing block 12. The pattern 416 possesses a structure identical to the patterns 322 and 412 but exhibits a smaller width. The advantage of using the set of masks corresponding to the patterns 411 to 416 instead of the set of masks 32 is that the number of photo-repetitions required is considerably decreased on account of the presence of a pattern comprising a region 411 making it possible to form two blocks of square pixels during one and the same exposure of the reticle. It is noted that each mask of the set of masks 41 comprises six distinct regions allowing respectively the production, by photolithography, of six patterns 411, 412, 413, 414 and 415.

FIGS. 5A and 5B represent a third example of sets of masks making it possible to produce the sensor 21 of FIG. 2. FIG. 5A represents a first set of masks 51, allowing the production of the ten patterns 510 to 519 and FIG. 5B a second set of masks 52, allowing the production of one or more. The first set of masks 51 comprises ten patterns 510 to 519. The patterns 510, 511 and 512 are respectively identical to the patterns 311, 312 and 321 of the sets of masks 31 and 32. The pattern 513 comprises a region making it possible to form a column reading block 13 with connection pads 131 and a cutting line 25 segment parallel to the rows of pixels. It also comprises a region making it possible to form a routing block 26 and a cut line segment 25 parallel to the rows of pixels. The patterns 514, 515 and 517 each make it possible to form two routing blocks 26 oriented parallel to the columns of pixels and cutting line segments 25. The pattern 516 makes it possible to print a row addressing block 12 parallel to the columns of pixels. The pattern 518 is substantially identical to the pattern 513. It differs therefrom by a smaller width. The second set of masks 52 comprises a single pattern 521 making it possible to form four square blocks of pixels 241. The first set of masks 51 can be used alone to form the whole of the sensor 21. The drawback of this set of masks is that the dimensions of the pattern 512, representing a square block of pixels, are relatively limited. Thus, the second set of masks 52 can be used, as a supplement, to minimize the number of photo-repetitions.

It is noted that each mask of the set of masks 51 comprises ten distinct regions allowing respectively the production, by photolithography, of ten patterns 510, 511, 512, 513, 514, 515, 516, 517, 518. Each mask of the set of masks 52 comprises a region, allowing the production of a pattern 521, the latter corresponding to four adjacent patterns 241.

FIG. 6 represents a second exemplary embodiment of a sensor according to the invention. This sensor 61 differs mainly from the sensor 21 of FIG. 2 by the arrangement of the row addressing blocks 12. The sensor 61 also comprises blocks of pixels 24 of square or triangular shape which form an octagonal photosensitive zone 23. The column reading blocks 13 are also situated on three adjacent sides, in this instance the sides 23D to 23F. The row addressing blocks 12 are situated on the opposite sides of the octagon, namely on the sides 23H, 23A and 23B, respectively. On each of these sides, the blocks 12 are mutually aligned. In order to make it possible to address each row of pixels, the sensor 61 furthermore comprises control buses and metallized holes 62 produced within the photosensitive zone 23. In particular, metallized holes are present in certain pixels 24, called via pixels 243. A first series of metallized holes is produced between the middle of the side 23G and the middle of the side 23A, and a second series of metallized holes is produced between the middle of the side 23E and the middle of the side 23C. The pixels 24 and the row conductors are formed on a first metallized layer of the semi-conducting wafer 22, in this instance one of its exterior faces. The control buses are formed on another metallized layer of the semi-conducting wafer 22, for example on the opposite exterior face. They are oriented parallel to the columns of pixels and are linked to the row addressing blocks 12. Each metallized hole 62 connects one of the row conductors to one of the control buses. The metallized holes 62 of the first series make it possible to address the rows of pixels of the upper half of the sensor 61 and the metallized holes of the second series make it possible to address the rows of pixels of the lower half. In FIG. 6, for the sake of clarity, only one metallized hole per via pixel 243 is represented. However, a via pixel 243 comprises as many metallized holes as row conductors. For a sensor comprising pixels such as those represented in FIG. 1, each via pixel 243 comprises two metallized holes, a first for connecting a conductor $X_i$ and a second for connecting the conductor $X_{RAZi}$. Furthermore, in the case where the reference 24 designates blocks of pixels rather than a lone pixel, each metallized hole 62 representation must be interpreted as corresponding to a group of metallized holes. Generally, the sensor 62 comprises a number of metallized holes which is equal to the total number of row conductors.

FIGS. 7A and 7B represent a first example of sets of masks making it possible to produce the sensor 61 of FIG. 6. The set of masks 71 represented in FIG. 7A allows the production of two patterns 711 and 712. The pattern 711 is substantially identical to the pattern 311 of FIG. 3A, except in that it comprises a region making it possible to form a row addressing block 12 instead of the region making it possible to form a routing block 26. Thus, the upper part makes it possible to form a triangular pixel 242 and an inclined column reading block 13, and the lower part makes it possible to form an inclined row addressing block 12 and a triangular block of pixels 242. The row addressing block 12 comprises connection pads 121 aligned with the cutting line 25 segment. The pattern 712 exhibits an axial symmetry with respect to the pattern 711 along an axis parallel to the columns of pixels. The set of masks 72 represented in FIG. 7B allows the production of four patterns 721 to 724. The first pattern 721 corresponds to two blocks of square pixels 241. The patterns 722 and 723 correspond respectively to the patterns 323 and 324 corresponding to the set of masks 32. The pattern 724 comprises a region making it possible to form a column reading block 13, a region making it possible to form a cutting line 25 segment and a region making it possible to form a row addressing block 12.

It is noted that each mask of the set of masks 71 comprises two distinct regions allowing respectively the production, by photolithography, of two patterns 711 and 712. Each mask of the set of masks 72 comprises ten distinct regions allowing respectively the production, by photolithography, of four patterns 721, 722, 723 and 724.

FIGS. 8A and 8B represent a second example of sets of masks making it possible to produce the sensor 61 of FIG. 6. The set of masks 81 represented in FIG. 8A makes it possible to produce six patterns 811 to 816. The patterns 811 and 812 are substantially identical to the patterns 711 and 712 of the set of masks 71, but have slightly smaller dimensions so as to leave room on the set of masks for other patterns. The pattern 813 makes it possible to form a square pattern 241. The pattern 814 comprises an upper part making it possible to form a column reading block 13 parallel to the rows of pixels and a line segment 25, and a lower part making it possible to form a row addressing block 12 parallel to the rows of pixels and a line segment 25. The pattern 815 comprises four regions making it possible to form ends of routing blocks 26. The pattern 816 comprises two routing blocks 26 parallel to the columns of pixels and two line segments 25. The set of masks 82 represented in FIG. 8B comprises a single pattern making it possible to form four square pixels 241. The set of masks 81 can be used alone to form the whole of the sensor 61.

FIG. 9 represents a third exemplary embodiment of a sensor according to the invention. This sensor 91 differs mainly from the sensor 61 of FIG. 6 in that the row addressing blocks 12 are situated on the same sides as the column reading blocks 13, in this instance on the sides 23D to 23F. Stated otherwise, the blocks 12 and 13 are merged within common blocks, called common-addressing blocks 92. A first advantage of this sensor 91 with respect to the sensor 61 is that it leaves more sides free for arranging the routing blocks 26. A second advantage is that all the connections can be produced on three sides of the octagonal sensor.

Figure 10A:
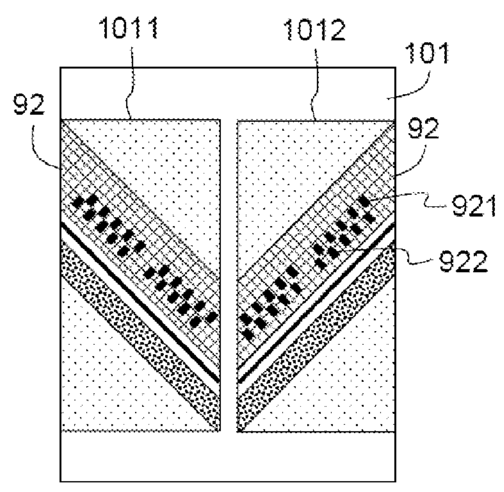
FIGS. 10A and 10B represent an example of sets of masks making it possible to produce the sensor of FIG. 9.
Figure 10B:
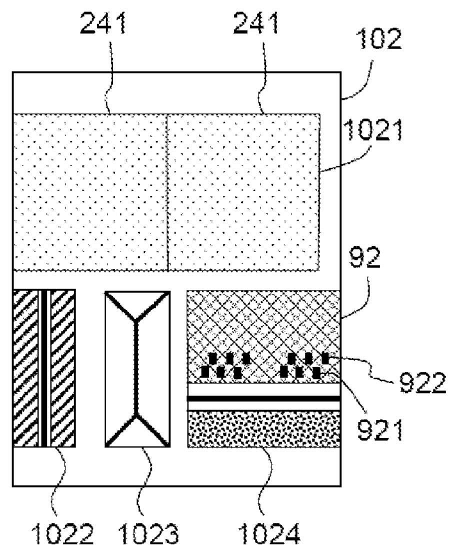

FIGS. 10A and 10B represent an example of sets of masks making it possible to produce the sensor 91 of FIG. 9. The set of masks 101 represented in FIG. 10A makes it possible to produce two patterns 1011 and 1012. These patterns are respectively identical to the patterns 311 and 312 of the set of masks 31, except in that the regions making it possible to form column reading blocks 13 are replaced with regions making it possible to form common-addressing blocks 92. These blocks 92 comprise for example a first line of connection pads 921 allowing the connection of the row conductors, and a second line of connection pads 922 allowing the connection of the column conductors. The set of masks 102 represented in FIG. 10B makes it possible to produce four patterns 1021 to 1024. The pattern 1021 is formed of a region making it possible to form two square pixels 241. The patterns 1022 and 1023 are respectively identical to the patterns 323 and 324 of the set of masks 32. The pattern 1024 is identical to the pattern 322 except in that the region making it possible to form a column reading block 13 is replaced with a region making it possible to form a common-addressing block 92 shared with connection pads 921 and 922.

Figure 11:
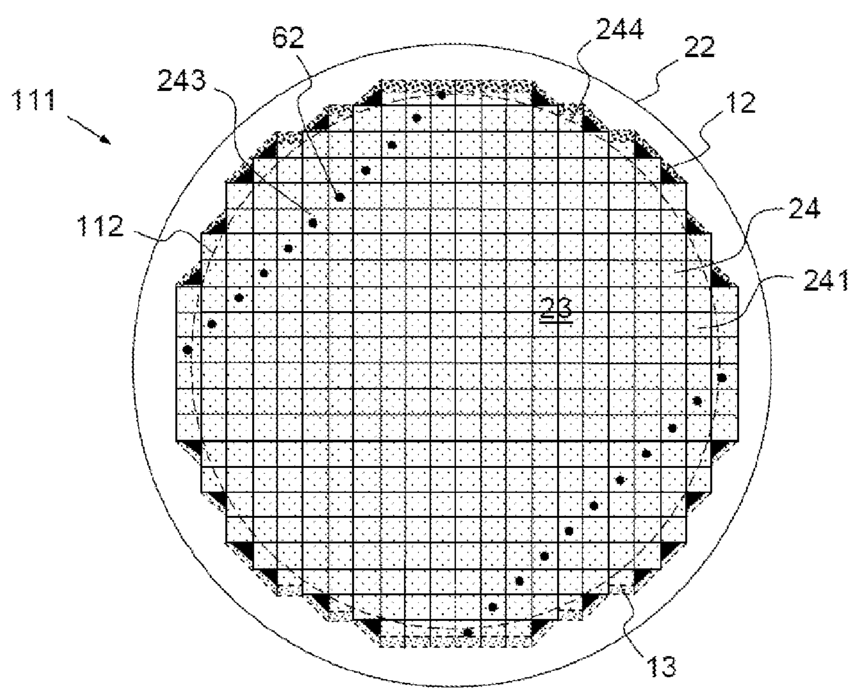
FIG. 11 represents a fourth exemplary embodiment of a sensor according to the invention.

FIG. 11 represents a fourth exemplary embodiment of a sensor according to the invention. This sensor 111 can be likened to the sensor 61 of FIG. 6. It differs therefrom mainly in that the photosensitive zone 23 is not octagonal and in that it is formed solely by blocks of pixels of rectangular shape. In particular, the photosensitive zone 23 is formed by blocks of square pixels 241, by via pixels 243 and by non-square rectangular pixels, called half-pixels 244. These pixels 241, 243 and 244 are disposed so as to follow as closely as possible the shape of a circle 112. It is recalled that the references 241, 243 and 244 can also designate blocks of pixels. Row addressing blocks 12 are arranged at the periphery of the photosensitive zone 23, forming substantially a semicircle. Column reading blocks 13 are arranged at the periphery of the photosensitive zone 23, forming substantially a semicircle, opposite from the semicircle formed by the row addressing blocks 12. Certain blocks 12 and 13 are oriented parallel to the rows of pixels 24, and others are inclined with respect to the rows and to the columns of pixels 24. The blocks 12 and 13 can notably be inclined for columns whose number of pixels is different from that of the adjacent columns.

Figure 12A:
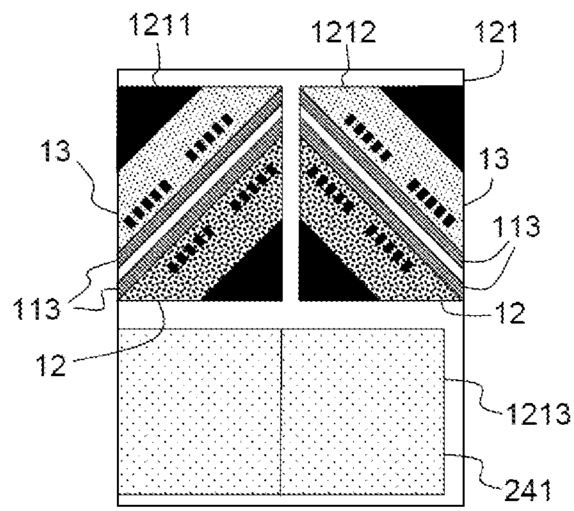
FIGS. 12A, 12B and 12C represent an example of sets of masks making it possible to produce the sensor of FIG. 11.
Figure 12B:
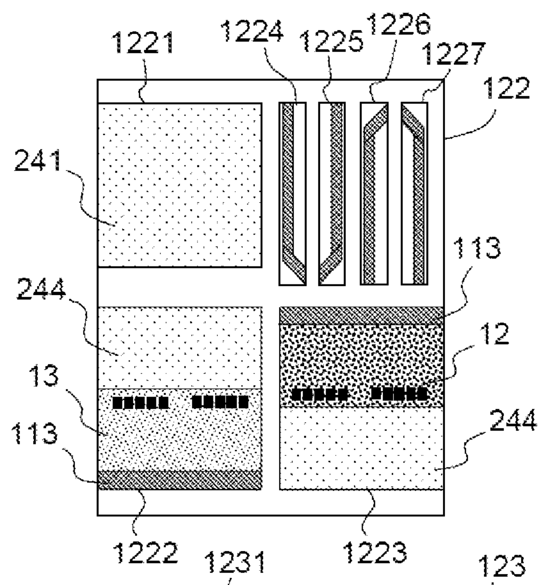
Figure 12C:
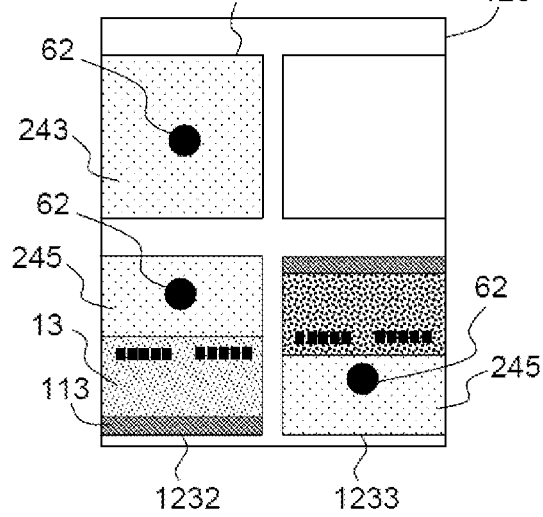

FIGS. 12A, 12B and 12C represent an example of sets of masks making it possible to produce the sensor 111 of FIG. 11. The set of masks 121 represented in FIG. 12A makes it possible to produce three patterns 1211 to 1213. The first pattern 1211 comprises a region making it possible to form an inclined column reading block 13 and a region making it possible to form a join line 113 adjacent to the block 13. It also comprises a region making it possible to form an inclined row addressing block 12 and a region making it possible to form a join line 113 adjacent to the block 12. The join lines 113 make it possible to ensure continuity between the blocks 12 or between the blocks 13 upon a discontinuity of the number of pixels per column. The pattern 1212 is symmetric to the pattern 1211 by symmetry along an axis oriented parallel to the columns of pixels. The pattern 1213 comprises a region making it possible to form two square pixels 241. The set of masks 122 makes it possible to produce seven patterns 1221 to 1227. The pattern 1221 makes it possible to form a square pixel 241. The pattern 1222 makes it possible to form a half-pixel 244 elongated in the direction of the rows of pixels, a column reading block 13 adjacent to the half-pixel 244, and a join line 113 adjacent to the block 13. The pattern 1223 makes it possible to form a half-pixel 244 elongate in the directions of the rows of pixels, a row addressing block 12 adjacent to the half-pixel 244, and a join line 113 adjacent to the block 12. The patterns 1224 to 1227 make it possible to form various join lines each comprising a portion aligned parallel to the columns of pixels, and a portion inclined with respect to the rows and to the columns of pixels. The set of masks 123 makes it possible to produce three patterns 1231 to 1233 identical to the patterns 1221 to 1223, except in that the square pixel 241 is replaced with a via pixel 243, and in that each half-pixel 244 is replaced with a via half-pixel 245, that is to say a half-pixel comprising a metallized hole 62.

Figure 13:
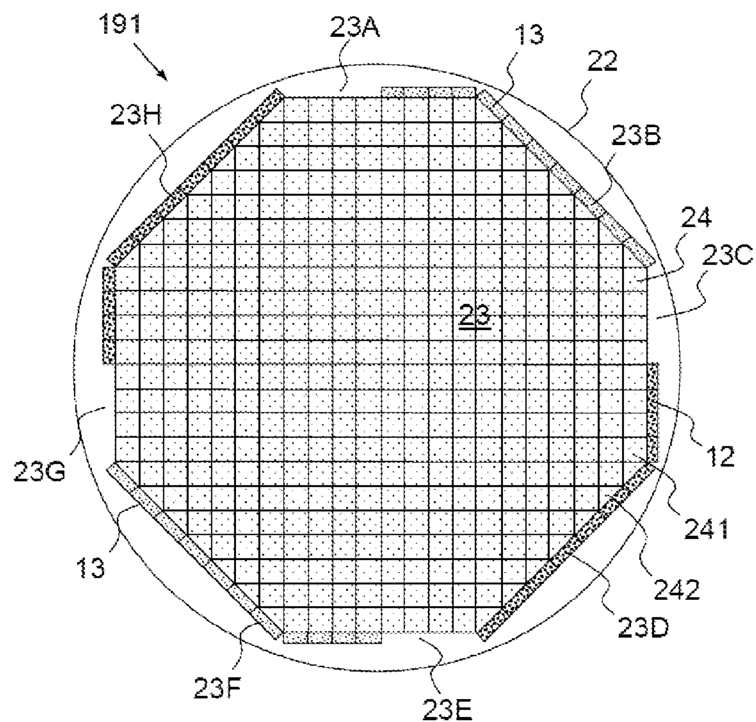
FIG. 13 represents a fifth exemplary embodiment of a sensor according to the invention.

FIG. 13 represents a fifth exemplary embodiment of a sensor according to the invention. This sensor 191 comprises an octagonal photosensitive zone 23 formed of square pixels 241 and triangular pixels 242. The row addressing blocks 12 are situated at the periphery of the photosensitive zone 23, on the side 23D of the octagon, on that half of the side 23C that is adjacent to the side 23D, on the side 23H, and on that half of the side 23G that is adjacent to the side 23H. In a more general manner, the row addressing blocks 12 are situated on a first and a second side of the octagon, which are mutually opposite, on a part of a third side adjacent to the first side, and on a part of a fourth side opposite the third side, the two parts being complementary to one another so as to allow the addressing of all the rows of pixels 24. It is notably possible for one of the parts to occupy a whole side, the blocks 12 then being situated on only three sides of the octagon. In an analogous manner, the column reading blocks 13 are situated on a fifth and a sixth side, which are mutually opposite, on a part of a seventh side adjacent to the fifth side, and on a complementary part of an eighth side. In this instance, the blocks 13 are situated on the sides 23B and 23F, on that half of the side 23A which is adjacent to the side 23B and on the half 23E adjacent to the side 23F. A cutting line 25, not represented, can also be formed on the semi-conducting wafer 22 so as to surround the photosensitive zone and the blocks 12 and 13.

Figures 14A, 14B:
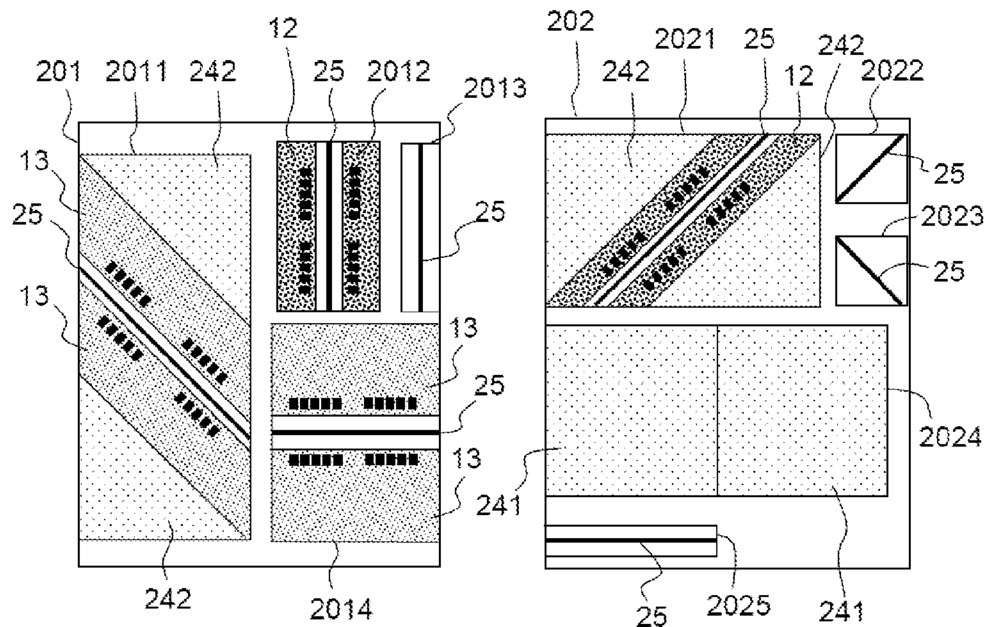
FIGS. 14A and 14B represent an example of sets of masks making it possible to produce the sensor of FIG. 13.

FIGS. 14A and 14B represent an example of sets of masks making it possible to produce the sensor 191 of FIG. 13. The set of masks 201 represented in FIG. 14A makes it possible to produce four patterns 2011 to 2014. The pattern 2011 comprises an upper part and a lower part which are separated by a cutting line 25 segment inclined with respect to the rows and to the columns of pixels. Each part comprises a region making it possible to form an inclined column reading block 13 and a triangular block of pixels 242. The pattern 2012 comprises two row addressing blocks 12 oriented parallel to the columns of pixels and separated by a cutting line 25 segment. The pattern 2013 comprises a region making it possible to form a cutting line 25 segment oriented parallel to the columns. The pattern 2014 comprises two column reading blocks 13 oriented parallel to the rows of pixels and separated by a cutting line 25 segment. The set of masks 202 represented in FIG. 14B comprises five patterns 2021 to 2025. The pattern 2021 comprises a left part and a right part which are separated by a cutting line 25 segment inclined with respect to the rows and to the columns of pixels. Each part comprises a region making it possible to form an inclined row addressing block 12 and a triangular pixel 242. The patterns 2022 and 2023 make it possible to form inclined cutting line segments 25. The pattern 2024 comprises two blocks of square pixels 241 and the pattern 2025 makes it possible to form a cutting line 25 segment oriented parallel to the rows of pixels.

Figure 15:
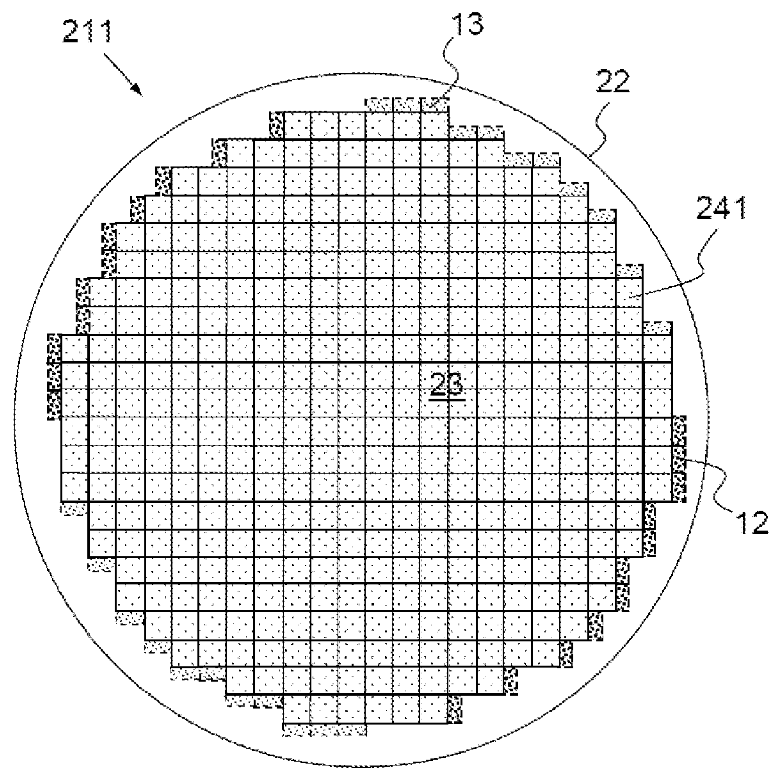
FIG. 15 represents a sixth exemplary embodiment of a sensor according to the invention.

FIG. 15 represents a sixth exemplary embodiment of a sensor according to the invention. This sensor 211 comprises a photosensitive zone 23 formed solely of blocks of square pixels 241. A part of the row addressing blocks 12 is situated at one of the ends of the rows of pixels, and the remainder of the row addressing blocks 12 is situated at the opposite end of the rows of pixels. More precisely, in this exemplary embodiment, the row addressing blocks 12 are situated at the left end of the rows of pixels on the upper half of the sensor 211, and at the right end on the lower half. In an analogous manner, a part of the column reading blocks 13 is situated at a first end of the columns of pixels, and the remainder of the column addressing blocks 13 is situated at the second end of the columns of pixels. In this instance, the column addressing blocks 13 are situated at the lower end of the columns of pixels on the left part of the sensor 211, and at the upper end on the right part. The row addressing blocks 12 are thus aligned with the columns of pixels, and the blocks 13 with the rows of pixels.

Figure 16:
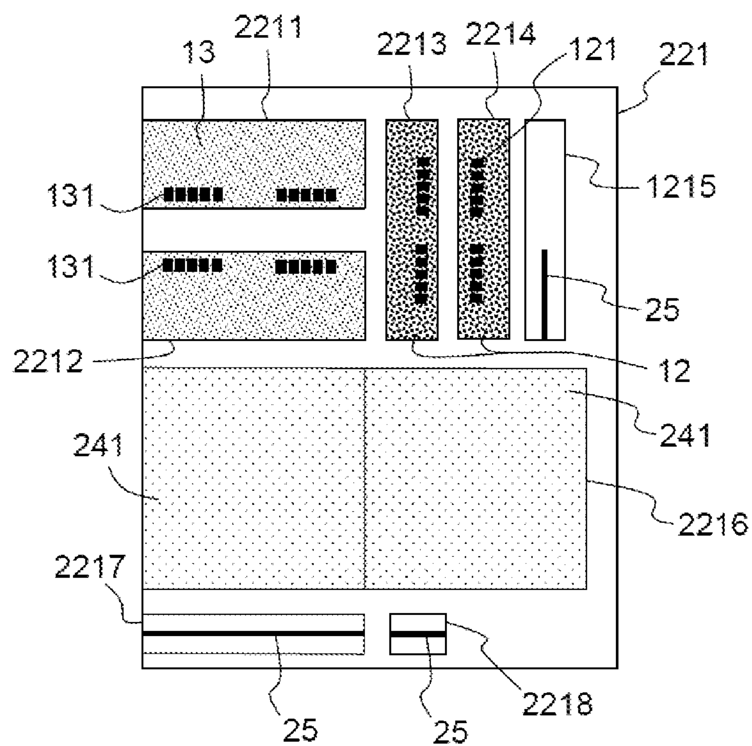
FIG. 16 represents an exemplary mask set making it possible to produce the sensor of FIG. 15.

FIG. 16 represents an exemplary set of masks making it possible to produce the sensor 211 of FIG. 15. The set of masks 221 makes it possible to produce eight patterns 2211 to 2218. The pattern 2211 makes it possible to form a column reading block 13 for the left part of the sensor 211. The connection pads 131 of this block 13 are situated in proximity to its lower part. The pattern 2212 makes it possible to form a column reading block 13 for the right part of the sensor 211. The connection pads 131 of this block are situated in proximity to its upper part. The patterns 2213 and 2214 make it possible to form row addressing blocks 12 for the lower and upper parts, respectively, of the sensor 211. The connection pads 121 of the block 12 formed by the pattern 2213 are situated in proximity to its right part, and the connection pads 121 of the block 12 formed by the pattern 2214 are situated in proximity to its left part. The pattern 2215 makes it possible to form a cutting line 25 segment oriented parallel to the columns of pixels. The patterns 2217 and 2218 make it possible to form cutting line segments 25 oriented parallel to the rows of pixels. And the pattern 2216 makes it possible to form two square pixels 241.

The invention claimed is:

1. A method for producing by photolithography an imaging device on a semi-conducting wafer having forming a substrate and an image zone produced on the substrate with a group of pixels disposed in rows and columns, the number of pixels per column not being uniform for all the columns of pixels, where each pixel has a charge collector element collecting electric charges generated as a function of a photon radiation received by the imaging device, with row conductors (Xi, XRAZi) linking the pixels row by row, column conductors (Yj) linking the pixels column by column, and row addressing blocks linked to the row conductors (Xi, XRAZi) to address each row of pixels individually, and column reading blocks linked to the column conductors (Yj) to read the electric charges collected by the pixels of the row selected by the row addressing blocks, the column reading blocks being situated at the periphery of the image zone, the row addressing blocks and the column reading blocks being produced on the same substrate as the image zone;

the method comprising a step in which a surface of the semi-conducting wafer is exposed zone by zone to a radiation through at least two sets of masks; each set of masks comprising several masks; each mask of one and the same set of masks including several regions, each region corresponding to a particular pattern; the at least two mask sets being configured to be able to produce, by photolithography, various patterns on the surface of the semi-conducting wafer; the image zone being obtained by the successive production of patterns, adjacent to one another, on the surface of the semi-conducting wafer; the image zone thus obtained exhibiting a surface area of greater than or equal to 10 $cm^2$;

wherein the number of patterns implemented is strictly greater than 1 and less than 15.

2. The method as claimed in claim 1, in which each mask of the at least two sets of masks comprises n distinct regions, allowing respectively the production, by photolithography, of n patterns; n being an integer lying between 1 and 15.

3. The method as claimed in claim 1, in which the number of patterns implemented is less than 8.

4. The method as claimed in claim 1, in which the image zone is obtained by the production of patterns formed by means of two or three sets of masks.

5. The method as claimed in claim 1, in which the peripheral pixels of the image zone form substantially a polygon comprising at least 5 sides.

6. The method as claimed in claim 1, in which the peripheral pixels of the image zone form substantially a polygon comprising a number less than 20 of sides.

7. The method as claimed in claim 1, in which the peripheral pixels of the image zone form substantially a regular octagon.

8. The method as claimed in claim 1, in which each row addressing block is formed by the production of a pattern comprising a region corresponding to said row addressing block, at least one of the patterns forming a row addressing block exhibiting shapes inclined with respect to the rows and to the columns of pixels.

9. The method as claimed in claim 1, in which each column reading block is formed by the production of a pattern comprising a region corresponding to said block, at least one of the patterns forming a column reading block exhibiting shapes inclined with respect to the rows and to the columns of pixels.

10. The method as claimed in claim 1, in which the set or sets of masks are of rectangular shape, each pattern to be produced on the semi-conducting wafer being selected by one or more obturation flaps.

11. The method as claimed in claim 1, in which the surface of the semi-conducting wafer is exposed through a set of masks, each mask of which comprises a region to form a cutting line surrounding the image zone, the row addressing blocks and the column reading blocks; the cutting line facilitating the cutting of the semi-conducting wafer; the method comprising, furthermore, a step of cutting the semi-conducting wafer along the cutting line to form a sensor.

12. The imaging device obtained by a photolithographic method as claimed in claim 1.

13. The imaging device as claimed in claim 12, in which at least two column reading blocks are contiguous with pixels belonging to rows of distinct ranks.

14. The imaging device as claimed in claim 12, in which the number of pixels per column is adapted in such a way that the peripheral pixels of the image zone form substantially a polygon comprising at least 5 sides.

15. The imaging device as claimed in claim 14, in which the polygon comprises a number less than 20 of sides.

16. The imaging device as claimed in claim 14, in which the peripheral pixels of the image zone form substantially a regular octagon.

17. The imaging device as claimed in one of claim 14, in which the column reading blocks are clustered together in groups, each group being parallel to one of the sides of the polygon.

18. The imaging device as claimed in claim 16, in which the column reading blocks of a first group are situated on a first side of the regular octagon, the column reading blocks of a second group are situated on a second side adjacent to the first, and the column reading blocks of a third group are situated on a third side adjacent to the second side.

19. The imaging device as claimed in claim 12, in which the row addressing blocks are situated at the periphery of the image zone.

20. The imaging device as claimed in claim 18, in which the row addressing blocks are situated on sides of the regular octagon that are opposite the first, the second and the third side, the row conductors being formed on a first face of the substrate, comprising, furthermore, control buses formed on a second face (metallic layer) of the substrate and metallized holes formed in the image zone, the control buses being oriented parallel to the columns of pixels and being linked to the row addressing blocks, the metallized holes linking each row conductor ($X_i$, $X_{RAZi}$) to one of the control buses.

21. The imaging device as claimed in claim 18, in which the row addressing blocks are situated on the same sides of the regular octagon as the column reading blocks, the row conductors being formed on a first face (metallic layer) of the substrate, comprising, furthermore, control buses formed on a second face (metallic layer) of the substrate and metallized holes formed in the image zone, the control buses being oriented parallel to the columns of pixels and being linked to the row addressing blocks, the metallized holes linking each row conductor ($X_i$, $X_{RAZi}$) to one of the control buses.

22. The imaging device as claimed in claim 16, in which the column reading blocks are situated on a part of a first side of the regular octagon, on a second side adjacent to the first side, on a part of a third side opposite the first side, and on a fourth side opposite the second side, the parts of the first and third sides being complementary so as to allow the reading of each of the columns of pixels of the image zone, the row addressing blocks being situated on a part of a fifth side adjacent to the second side, on a sixth side adjacent to the third and fifth sides, on a part of a seventh side opposite the fifth side, and on an eighth side opposite the sixth side, the parts of the fifth and seventh sides being complementary so as to allow the addressing of each of the rows of pixels of the image zone.

23. The imaging device as claimed in claim 11, in which the row addressing blocks are situated inside the image zone.

24. The imaging device as claimed in claim 23, in which the row addressing blocks are adjacent to one of the columns of pixels comprising the largest number of pixels.

25. The imaging device as claimed in claim 12, in which the row addressing blocks are situated at the periphery of the image zone, some row addressing blocks being parallel to the rows of pixels and some row addressing blocks being inclined with respect to the rows and to the columns of pixels, the row conductors being formed on a first face (metallic layer) of the substrate, comprising, furthermore, control buses formed on a second face (metallic layer) of the substrate and metallized holes formed in the image zone, the control buses being oriented parallel to the columns of pixels and being linked to the row addressing blocks, the metallized holes linking each row conductor ($X_i$, $X_{RAZi}$) to one of the control buses.

26. The imaging device as claimed in claim 12, in which each column reading block is parallel to the rows of pixels, the row addressing blocks being situated at the periphery of the image zone, parallel to the rows of pixels, the row conductors being formed on a first face (metallic layer) of the substrate, comprising, furthermore, control buses formed on a second face (metallic layer) of the substrate and metallized holes formed in the image zone, the control buses being oriented parallel to the columns of pixels and being linked to the row addressing blocks, the metallized holes linking each row conductor ($X_i$, $X_{RAZi}$) to one of the control buses.

27. The imaging device as claimed in claim 12, in which each column reading block is parallel to the rows of pixels, a part of the column reading blocks being situated at a first end of the columns of pixels and another part being situated at a second end of the columns of pixels, the two parts being complementary so as to allow the reading of each of the columns of pixels of the image zone, the row addressing blocks being situated at the periphery of the image zone, parallel to the columns of pixels, a part of the row addressing blocks being situated at a first end of the rows of pixels and another part being situated at a second end of the rows of pixels, the two parts being complementary so as to allow the addressing of each of the rows of pixels of the image zone.

28. The imaging device as claimed in claim 12, in which the peripheral pixels of the image zone form substantially a convex hexagon a first side of which is parallel to the rows of pixels, a second and a third side of which, both adjacent to the first side, are parallel to the columns of pixels, a fourth and a fifth side of which, respectively adjacent to the second and to the third side, are inclined with respect to the rows and to the columns of pixels, and a sixth side of which, adjacent to the fourth and to the fifth side, is parallel to the rows of pixels.

29. The imaging device as claimed in claim 12, in which each pixel comprises a photosensitive element (Dp(i,j)) generating electric charges as a function of a radiation received by the imaging device.

30. The imaging device as claimed in claim 29 comprising, furthermore, a scintillator coupled optically to a sensor and to convert an X-ray or gamma-ray radiation into a radiation to which the photosensitive elements (Dp(i,j)) are sensitive.

31. The imaging device as claimed in claim 12, in which the charge collector element of each pixel comprises an electrode for collecting electric charges.

32. The imaging device as claimed in claim 31 further comprising a photoconductor coupled electrically to the electrodes for collecting charges of the pixels of a sensor, the photoconductor configured to convert an X-ray or gamma-ray radiation into electric charges.

33. The imaging device as claimed in claim 32, in which the photoconductor is made of cadmium telluride (CdTe), of a compound comprising telluride, cadmium and zinc ($Cd_xTe_yZn_z$), of gallium arsenide (AsGa), of mercury iodide ($HgI_2$), of lead oxide (PbO), of lead iodide ($PbI_2$), or of Selenium (Se).

34. The imaging device as claimed in claim 12, in which each row addressing block and each column reading block comprises connection pads able to link the row conductors ($X_i$, $X_{RAZi}$) and the conductors of columns ($Y_j$) to external circuits, said connection pads being aligned in each block in one or more lines.

35. The imaging device as claimed in claim 34, in which the connection pads of each block are aligned with the edges of the substrate.

* * * * *